United States Patent
Reykowski

(10) Patent No.: US 9,417,299 B2
(45) Date of Patent: Aug. 16, 2016

(54) USING MEMRISTOR DEVICES AS SWITCHES FOR MRI RF COILS

(75) Inventor: Arne Reykowski, Gainesville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 1082 days.

(21) Appl. No.: 13/376,615

(22) PCT Filed: May 17, 2010

(86) PCT No.: PCT/IB2010/052181
§ 371 (c)(1),
(2), (4) Date: Dec. 7, 2011

(87) PCT Pub. No.: WO2010/146487
PCT Pub. Date: Dec. 23, 2010

(65) Prior Publication Data
US 2012/0081115 A1    Apr. 5, 2012

Related U.S. Application Data

(60) Provisional application No. 61/218,493, filed on Jun. 19, 2009.

(51) Int. Cl.
*G01R 33/3415* (2006.01)
*G01R 33/36* (2006.01)

(52) U.S. Cl.
CPC ........ *G01R 33/3415* (2013.01); *G01R 33/3657* (2013.01); *G01R 33/3664* (2013.01)

(58) Field of Classification Search
USPC .......................... 324/300–322; 600/407–435; 382/128–131; 343/745–749
See application file for complete search history.

(56) References Cited

U.S. PATENT DOCUMENTS 4,777,443 A    10/1988    Yabusaki et al.
4,855,680 A     8/1989    Arakawa et al.
(Continued)

FOREIGN PATENT DOCUMENTS

EP    0590712 A1    4/1994
RU    2068575 C1   10/1996
(Continued)

OTHER PUBLICATIONS

Adee, S.; The Mysterious Memristor; Dec. 17, 2008; IEEE Spectrum; http://www.spectrum.ieee.org/print/6207.
(Continued)

*Primary Examiner* — Melissa Koval
*Assistant Examiner* — Tiffany Fetzner

(57) ABSTRACT

A radiofrequency (RF) coil assembly (18,18') for use in a magnetic resonance system (10) includes a radiofrequency coil (42) and a plurality of memory resistive elements (46,56, 62,72) which each retains a selected resistive state after a control signal is removed. A detune circuit (44), part of the radiofrequency coil assembly, includes a memory resistive element (46) which switches the radiofrequency coil between a tuned and detuned state. Connected between the radiofrequency coil and a pre-amplifier (52), a blanking circuit (54) includes a memory resistive element (56) to short circuit an input of the pre-amplifier. A multiplexing circuit (60) includes a plurality of memory resistive elements (62) to selectively couple the selected outputs of the radiofrequency coils to a receiver (26). A biasing circuit (27) generates the control signal to set the memory resistive elements (46,56) to a first resistive state during a transmit mode and to a second resistive state during a receive mode magnetic resonance system.

19 Claims, 2 Drawing Sheets

(56) References Cited

U.S. PATENT DOCUMENTS

Figure 1:
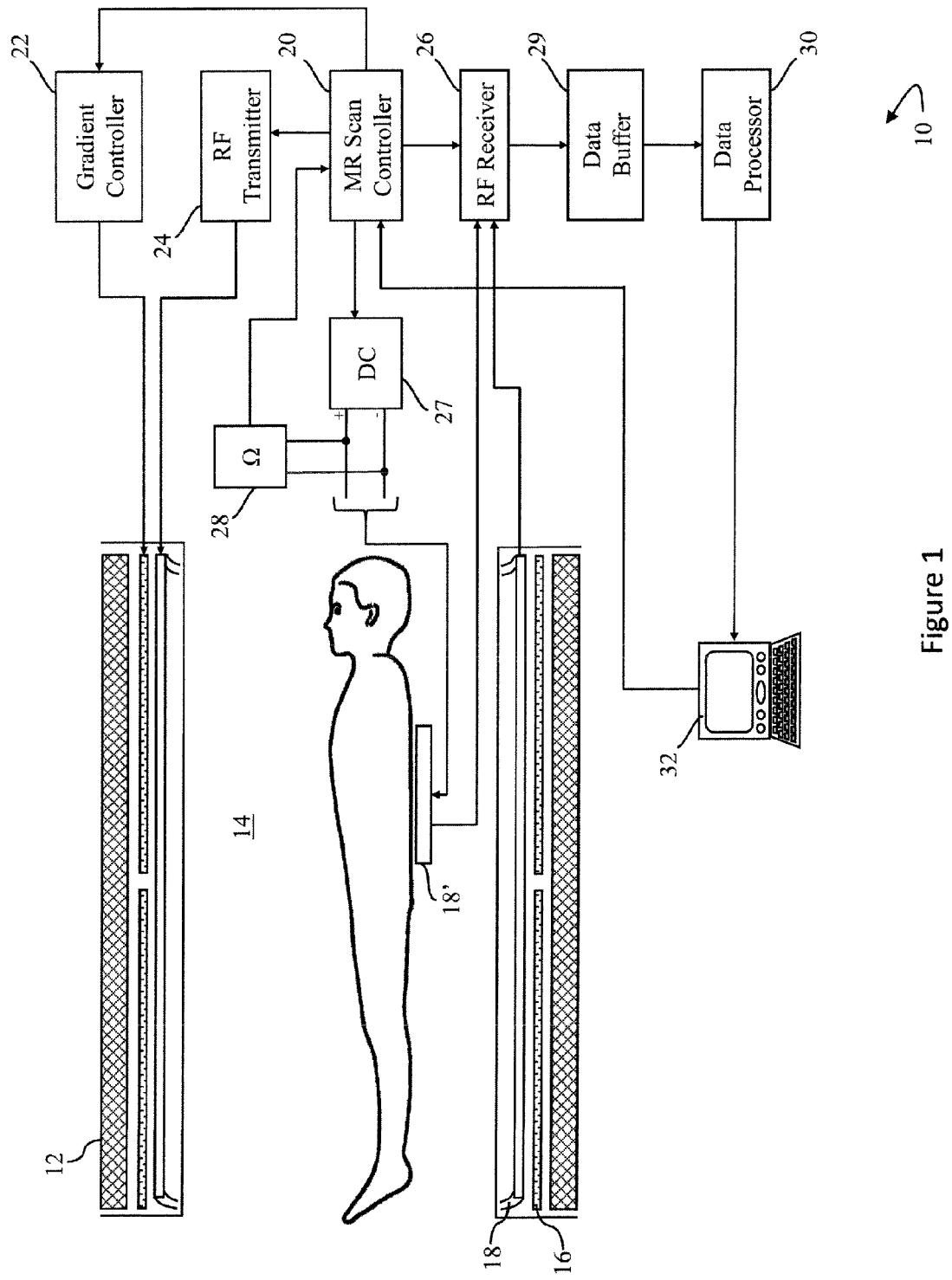

| | | | |
|---|---|---|---|
| 6,263,229 B1 | 7/2001 | Atalar et al. | |
| 6,853,193 B2 | 2/2005 | Riederer | |
| 7,030,614 B2 | 4/2006 | Matschl et al. | |
| 7,173,426 B1 | 2/2007 | Bulumulla | |
| 7,821,471 B2 * | 10/2010 | Yoshioka | H01Q 1/38 343/700 MS |
| 7,898,844 B2 * | 3/2011 | Wang | G01R 33/098 365/158 |
| 7,986,140 B2 * | 7/2011 | Hu | G01R 33/028 324/207.25 |
| 8,081,129 B1 * | 12/2011 | Santori et al. | 343/749 |
| 2002/0198450 A1 | 12/2002 | Reykowski | |
| 2005/0275064 A1 | 12/2005 | Li | |
| 2007/0200767 A1 * | 8/2007 | Yoshioka | H01Q 1/38 343/700 MS |
| 2008/0090337 A1 | 4/2008 | Williams | |
| 2008/0191699 A1 | 8/2008 | Gauss et al. | |
| 2008/0284435 A1 | 11/2008 | Overweg | |
| 2008/0307151 A1 | 12/2008 | Mouttel | |
| 2009/0075694 A1 | 3/2009 | Kim | |
| 2009/0128153 A1 | 5/2009 | Graesslin et al. | |
| 2010/0109656 A1 * | 5/2010 | Wang | G01R 33/098 324/210 |
| 2012/0081115 A1 * | 4/2012 | Reykowski | 324/309 |
| 2012/0212375 A1 * | 8/2012 | Depree, IV | 343/700 MS |

FOREIGN PATENT DOCUMENTS

| | | |
|---|---|---|
| SU | 523451 A1 | 7/1976 |
| WO | 2008078270 A1 | 7/2008 |
| WO | 2008108822 A2 | 9/2008 |
| WO | 2009075694 A1 | 6/2009 |

OTHER PUBLICATIONS

Chua, L. O.; Memristor—The Missing Circuit Element; 1971; IEEE Trans. on Circuit Theory; CT-18(5)507-519.

Flemish, J., et al.; Microstrip Patch with Adaptive Conductivity; 2007; IEEE Trans. on Antennas and Propagation; pp. 5187-5190.

Stewart, D. R., et al.; Molecule-Independent Electrical Switching in Pt/Organic Monolayer/Ti Devices; 2004; Nano Letters; 4(1)133-136.

Strukov, D. B., et al.; The missing memristor found; 2008; Nature; 453:80-83.

Wong, E. Y., et al.; An Optical System for Wireless Detuning of Parallel Resonant Circuits; 2000; J. of Magnetic Resonance Imaging; 12(4)632-638.

Yang, J. J., et al.; Memristive switching mechanism for metal/oxide/metal nanodevices; 2008; Nature Nanotechnology; 3:429-433.

Beckett, Jamie, "Engineering Memristor: Control over device could pave way for computers that learn" 2008.

Beckett, Jamie, "Demystifying the Memristor: Proof of fourth basis circuit element could transform computing", 2008.

Chua, "Memristor", 1971.

\* cited by examiner

USING MEMRISTOR DEVICES AS SWITCHES FOR MRI RF COILS

CROSS REFERENCE TO RELATED APPLICATIONS

This application claims the benefit of U.S. provisional application Ser. No. 61/218,493 filed Jun. 19, 2009, which is incorporated herein by reference.

The present application relates to magnetic resonance imaging. It finds particular application in conjunction with on board circuitry for radio frequency coils in magnetic resonance scanners.

A magnetic resonance imaging (MRI) and spectroscopy (MRS) system are often used for the examination and treatment of patients. By such a system, the nuclear spins of the body tissue to be examined are aligned by a static main magnetic field $B_0$ and are excited by transverse magnetic fields $B_1$ oscillating in the radiofrequency band. In imaging, relaxation signals are exposed to gradient magnetic fields to localize the resultant resonance. The relaxation signals are received in order to form in a known manner a single or multi-dimensional image. In spectroscopy, information about the composition of the tissue is carried in the frequency component of the resonance signals.

Two types of MR systems that are in common use include "open" MR systems (vertical system) and "bore-type" systems. In the former, the patient is introduced into an examination zone which is situated between two magnetic poles connected by a C-shaped unit. The patient is accessible during the examination or treatment from practically all sides. The latter comprises a cylindrical examination space (axial system) into which a patient is introduced.

An RF coil system provides the transmission of RF signals and the reception of resonance signals. In addition to the RF coil system which is permanently built into the imaging apparatus, special purpose coils can be flexibly arranged around or in a specific region to be examined. Special purpose coils are designed to optimize signal-to-noise ratio (SNR), particularly in situations where homogeneous excitation and high sensitivity detection is required. Furthermore, special sequences of RF signals, higher field strengths, high flip angles or real-time sequences can be realized and generated by multi-channel antenna arrangements, and multi-dimensional excitations can be accelerated.

During the transmit phase of the magnetic resonance procedure, transmit RF signals are orders of magnitude greater than the resonance signal generated by the excited nuclei. To maintain patient safety and to protect the sensitive receiver circuitry along with the coils, it known to use semiconductor switches, particularly PIN diodes, in conjunction with circuitry to protect the receiver equipment. For example, decoupling or detuning the receive coils is achieved by coupling an LC circuit to the receive coil via a PIN diode to change its resonance frequency and block the transmit signals from inducing a current in the coil. Blanking the pre-amplifiers, which involves a PIN diode actuated short circuit at the input of the pre-amplifier, provides additional protection to the pre-amplifier circuits. PIN diodes are also used in coil selection and switching circuitry, e.g. a multiplexer including a PIN diode matrix in which a control signal will activate/deactivate selected coil elements to be connected with the MR system.

PIN diodes are typically used for many switching circuit implementations because of their speed, compactness, and non-magnetic packaging. Unfortunately, as technology has improved, both field strength and the number of coil elements in RF arrays has increased. This leads to a higher number of detune circuits inside coil arrays. Since each detune circuit requires a certain amount of bias current in order to properly function, the total amount of power to drive the detune circuits has increased too. It is therefore desirable to find solutions for detune circuits that require less drive power.

The present application provides new and improved switching circuits which overcomes the above-referenced problems and others.

In accordance with one aspect, a radiofrequency coil assembly includes a radiofrequency coil and a plurality of memory resistive elements. Each memory resistive element retains a selected resistive state after a control signal is removed.

In accordance with another aspect, a magnetic resonance imaging method includes transmitting radiofrequency signals to induce resonance signals and receiving the resonance signals. The resistive state of a memory resistive element is set to: detune an RF coil during transmission of RF signals, short an input to a pre-amplifier during transmission of RF signals, selectively couple one of a plurality of outputs to downstream processing, and store information.

One advantage resides in increased patient and equipment safety.

Another advantage resides in improved signal-to-noise ratio (SNR).

Another advantage resides in reduced system complexity.

Another advantage resides in reduced cost.

Another advantage resides in lower power consumption.

Another advantage resides in efficient utilization of space.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 2:
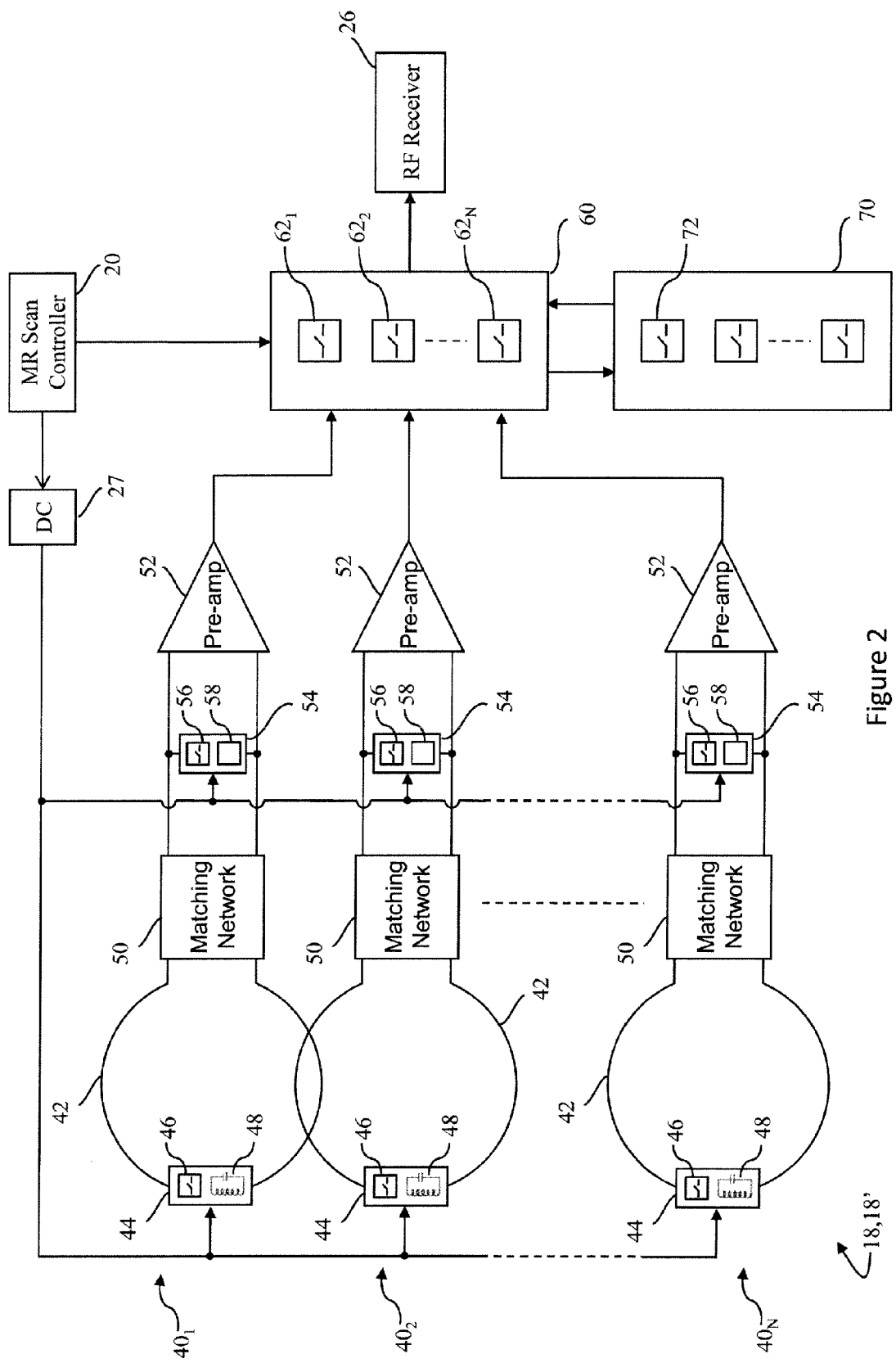

FIG. 1 is a diagrammatic illustration of a magnetic resonance imaging system; and FIG. 2 is a diagrammatic illustration of an MR coil employing memristor devices.

With reference to FIG. 1, a magnetic resonance (MR) imaging system 10 includes a main magnet 12 which generates a temporally uniform $B_0$ field through an examination region 14. The main magnet can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field for spatially encoding magnetic resonance signals, for producing magnetization-spoiling field gradients, or the like. The magnetic field gradient coil 16 may include coil segments configured to produce magnetic field gradients in three orthogonal directions, typically longitudinal or z, transverse or x, and vertical or y directions.

A radio-frequency (RF) coil assembly 18, such as a whole-body radio frequency coil, is disposed adjacent the examination region. The RF coil assembly generates radio frequency pulses for exciting magnetic resonance in dipoles of the subject. The radio frequency coil assembly 18 also serves to detect magnetic resonance signals emanating from the imaging region. Optionally, local, surface, or in vivo RF coils 18' are provided in addition to or instead of the whole-body RF coil 18 for more sensitive, localized spatial encoding, excitation, and reception of magnetic resonance signals.

To acquire magnetic resonance data of a subject, the subject is placed inside the examination region 14, preferably at or near an isocenter of the main magnetic field. A scan controller 20 controls a gradient controller 22 which causes the gradient coils to apply the selected magnetic field gradient pulses across the imaging region, as may be appropriate to a selected magnetic resonance imaging or spectroscopy sequence. The scan controller 20 also controls an RF transmitter 24 which causes the RF coil assembly to generate magnetic resonance excitation and manipulation $B_1$ pulses. The scan controller also controls an RF receiver 26 which is connected to the RF coil assembly to receive the generated magnetic resonance signals therefrom. The scan controller 20 also includes or controls a DC voltage source 27 which supplies positive or negative DC control voltages to increase or decrease the resistance of the memory resistive elements (memristors) (not shown in FIG. 1) on the receive coil 18, 18' as explained in greater detail below. In line with the DC voltage source 27 is a resistance unit 28 which measures the resistance across the memory resistive elements.

The received data from the receivers 26 is temporarily stored in a data buffer 29 and processed by a magnetic resonance data processor 30. The magnetic resonance data processor can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive. A graphic user interface or display device 34 includes a user input device which a clinician can use for controlling the scan controller 20 to select scanning sequences and protocols, display MR data, and the like.

The RF coil assembly 18, 18' includes several dedicated transmit coils and receive coils, each connected to the RF transmitter 24 and RF receiver 26, respectively. The RF transmitter includes multiple channels, each connected to at least one transmit coil, which collectively generates the resonance excitation and manipulation $B_1$ pulses in the transmit coils. Likewise, the RF receiver includes multiple channels, each connected to at least on receive coil, which receive the generated magnetic resonance signals. It should be appreciated that a single transmit coil and receive coil is also contemplated. Ideally, the transmit coils and receive coils should be completely isolated; however, during the transmit phase currents are induced in the receive coils which, in turn, generate RF fields that oppose the desired transmitted manipulation $B_1$ pulses locally near the receive coils. Furthermore, the induced currents can not only damage sensitive receive coils but also pose a threat to the subject's safety.

With reference to FIG. 2, the RF coil assembly 18, 18' includes a plurality of receive coils 40₁, 40₂, . . . , 40ᴺ which are diagrammatically illustrated. Each receive coil includes a coil segment 42 that is serially connected to a detuning circuit 44. The detuning circuit decouples the receive coil during the transmit phase of the imaging procedure. The circuit includes a memory resistive element or switch 46 or switching memristor connected in series with the coil segment. A memory resistive switch is a memristor based switch that provides controllable resistance according to a control signal through it and remembers the resistive state after the control signal is removed. Traditional detuning circuits employ a PIN diode switch; however, PIN diodes require a continuous control signal which may cause field distortions along the control signal transmission line unless it is properly shielded. Accordingly, at higher power transmit RF pulses an increasingly higher control signal to bias the PIN diode is required to ensure the coil segment remains decoupled.

Prior to the transmit phase, a control signal generated by the scan controller 20 actively biases the memory resistive switch, in one embodiment, into a conductive state to operatively couple a parallel resonant trap 48, balun, or the like to the corresponding coil segment. The resonant trap acts as large impedance to substantially block current flow in the coil segment. Accordingly, the resonant trap is tuned to the magnetic resonance frequency or Larmor frequency. In multi-nuclear magnetic resonance systems, more than one detuning circuit can be employed in which each resonant trap is tuned for a desired nuclear species, e.g. $^1H$, $^{31}P$, $^{19}F$, or the like. In another embodiment, the detuning circuit 44 includes a single memory resistive switch in series with the coil segment that acts as a large resistance to decouple the receive coil. In such an arrangement, the detuning circuit is inherently broadband and does not require tuning which is advantageous in multi-nuclear magnetic resonance systems. Furthermore, tuning the resonant trap has an associated cost and reliability factor. It should also be appreciated that more than one resonant trap for use in multi-nuclear magnetic resonance systems is also contemplated.

In another embodiment, the transmit pulse is used to induce the DC bias voltage to bias the memory resistive switch 46 to the highly resistive (or less resistive) state in the absence of a control signal. This arrangement can be realized by adding a passive control circuit to the memory resistive switch. The passive control circuit generates the necessary control signal from the RF signal itself, see for example in commonly owned publication WO/2008/078270 A1. This allows high currents, but not low currents, to see a parallel resonant circuit which decouples the coil segment. It should also be appreciated that both active and passive decoupling can by employed.

With continuing reference to FIG. 2, the receive coils, 40₂, . . . , 40ᴺ include matching networks 50 to match the characteristic impedance of a corresponding coil segment 42 to a single channel RF pre-amplifier 52. The matching network can be an adjustable matching network which permits the adjusting the matching impedance to accommodate the size of the subject and therefore compensate for the varying Q, quality factor, of the receive coil. For example, a larger object will lower the Q value resulting in an impedance mismatch, thus effecting image quality. A blanking circuit 54 is connected in parallel between the coil segment 42 and the pre-amplifier 52. In response to the DC bias signal generated by the scan controller 20 prior to the transmit phase, a memory resistive switch 56 included in the blanking circuit is biased into a conductive state which short circuits the input of the pre-amplifier. The blanking circuit 54 acts to protect the pre-amplifier 52 and other downstream electronics from excessive RF currents induced during the transmit phase of the imaging sequence. Additionally, the blanking circuit includes a biasing circuit 58 for monitoring the induced current. If a particular maximum power level is detected, the biasing circuit generates the control signal to bias the memory resistive switch, thus short circuiting the input of the pre-amplifier.

In one embodiment, the output of the pre-amplifier 52 is connected to a multi-channel (or multiple single channel) multiplexer circuit 60, each channel of the multiplexer corresponding to an output of a receive coil 40₁, 40₂, . . . , 40ᴺ. The multiplexer includes a plurality of memory resistive elements or switches 62₁, 62₂, . . . , 62ᴺ, each corresponding to a channel of the multiplexer and, in turn, a receive coil. A control signal, supplied by the scanner controller 20, biases one or a subset of memory resistive switches into a conductive state to couple one or more receive coils to downstream processing. In this manner, the receive coil can have more channels than the downstream processing circuitry, e.g. the RF receive 26.

Memory resistive elements on the receive coil can also perform a memory function. One example, the coil assembly includes a memory 70 that includes a plurality of memory resistive elements 72. In a binary embodiment, each element is biased in to a highly resistive state or a lowly resistive state to store information, such as coil ID, characteristics, use statistics, or the like as binary 1's and 0's. Because memristors can be set to a variety of resistances, the memory can be other than a binary memory, e.g. base 8, base 10, base 32, or the like.

In a more complex embodiment, the receive coil channels which the multiplexer 60 does not connect to the RF receiver 26 can be connected by another bank of memory resistive switches of the multiplexer to the memory 70. The receive channel information is digitized and stored in the resistive state of the memory resistive elements 72 while the receiver demodulates the other resonance signal channels from the multiplexer 60. Then, the multiplexer transfers the receive channel signals stored in the memory 70 to the RF receiver 26.

Continuing with reference to FIG. 1, the received data from the receivers 26 is temporarily stored in a data buffer 29 and processed by a magnetic resonance data processor 30. It should be appreciated that the data buffer including a plurality of memory resistive elements performing a memory function is also contemplated. The magnetic resonance data processor can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive. A graphic user interface or display device 34 includes a user input device which a clinician can use for controlling the scan controller 20 to select scanning sequences and protocols, display MR data, and the like.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A radiofrequency (RF) coil assembly configured for use in a magnetic resonance system, including:
    a preamplifier;
    a transmit radiofrequency coil;
    a receive radiofrequency coil; and
    a memory resistive element which retains a selected resistive state after a control signal is removed, wherein the memory resistive element functions as a switch and is connected between the receive radiofrequency coil and the pre-amplifier of the magnetic resonance system.

2. The RF coil assembly according to claim 1, further including:
    a biasing circuit which generates a control signal in order to set the memory resistive element into one of a plurality of resistive states.

3. The RF coil assembly according to claim 2, wherein the memory resistive element is part of a detuning circuit which switches the receive radiofrequency coil between a tuned state, tuned to a resonance frequency, and a detuned state.

4. The RF coil assembly according to claim 3, wherein the detune circuit includes:
    the memory resistive element in series with the receive radiofrequency coil, the resistance of the memory resistive element being switched between highly resistive and highly conductive states by the generated control signal.

5. The RF coil assembly according to claim 3, wherein the detune circuit includes:
    a resonant trap, the memory resistive element being switched by the generated control signal in order to connect the resonant trap in series with the receive radiofrequency coil.

6. The RF coil assembly according to claim 2, further including:
    a blanking circuit connected to the receive radiofrequency coil and the pre-amplifier, where the blanking circuit includes the memory resistive element which when biased into a conductive state, is configured, in order to short circuit an input into the pre-amplifier from the receive radiofrequency coil.

7. The RF coil assembly according to claim 6, wherein the memory resistive element is connected in parallel between the receive radiofrequency coil and the pre-amplifier.

8. The RF coil assembly according to claim 1 further including:
    a biasing circuit which generates the control signal in order to set the memory resistive element into a first resistive state when the RF coil assembly is in a transmit mode and into a second resistive state when the RF coil assembly is in a receive mode.

9. The RF coil assembly according to claim 1, further including:
    a multiplexing circuit including a plurality of memory resistive elements configured to couple to the receive radiofrequency coil at an output of the RF coil assembly.

10. The RF coil assembly according to claim 1, further including:
    a memory constructed with a plurality of the memory resistive elements that function as switches and are configured to store resistive state information.

11. The RF coil assembly according to claim 1, further including at least one of:
    a detuning circuit configured with the memory resistive element that is configured to block a selected RF frequency induced on the receive radiofrequency coil;
    a blanking circuit configured with the memory resistive element that is configured to selectively short circuit an input of the pre-amplifier; and
    a multiplexing circuit configured with a plurality of the memory resistive elements that are configured to selectively couple the output of the receive radiofrequency coil onto downstream processing circuitry.

12. The RF coil assembly according to claim 2, wherein the memory resistive element includes a mersister which is biased into a resistive state by a DC bias and holds said resistive state when the DC bias is removed.

13. The RF coil assembly according to claim 1, further including:
    circuitry which measures a resistance of the memory resistive element.

14. A magnetic resonance system, including:
    a magnet which generates a static magnetic field in an examination region;

at least one RF coil assembly according to claim 1 configured to acquire magnetic resonance data from the examination region;
a transmitter connected to the at least one RF coil assembly;
an RF receiver connected with the at least one RF coil assembly; and
a scan controller configured to control the RF transmitter and the RF receiver along with a control circuit that is configured to generate the control signal;
wherein the control circuit is configured to adjust the resistive state of the memory resistive element;
a data processor which processes magnetic resonance data from the RF receiver in order to produce one of magnetic resonance imaging data or magnetic resonance spectroscopy data; and
a display which displays results of the performed magnetic resonance signal processing.

15. A magnetic resonance method, including:
transmitting RF signals by a transmit radiofrequency (RF) coil in order to induce magnetic resonance signals in an examination region;
receiving the magnetic resonance signals with a receive radiofrequency (RF) coil; and
setting, in a magnetic resonance system, a resistive state of at least one memory resistive element, from a plurality of memory resistive elements, in order to short an input into a pre-amplifier in the magnetic resonance system, that amplifies the received magnetic resonance signals during transmission of the RF signals, wherein the at least one memory resistive element of the plurality of memory resistive elements functions as a switch and performs at least one of:
  detuning the receive RF coil that receives the magnetic resonance signals during transmission of the RF signals, and
  selectively coupling one of a plurality of outputs onto downstream processing.

16. The method according to claim 15, wherein setting the resistive state of the at least one memory resistive element includes:
applying a bias voltage of a first polarity to the at least one memory resistive element of the plurality of memory resistive elements in order to increase its resistance;
stopping applying the first polarity bias voltage at a first selected resistance, the at least one memory resistive element of the plurality of memory resistive elements holding the first selected resistance after the step of applying the biasing voltage has stopped;
applying a bias voltage of a second polarity to the at least one memory resistive element of the plurality of memory resistive elements in order to decrease its resistance; and
stopping applying the second polarity bias voltage at a second selected resistance, the at least one memory resistive element of the plurality of memory resistive elements holding the second selected resistance after the step of applying the biasing voltage has stopped.

17. The method according to claim 15, wherein the at least one memory resistive element of the plurality of memory resistive elements is connected in series with the receive RF coil and connects the receive RF coil with a resonant trap, the steps of setting the resistive state including:

before transmitting the RF signals, applying a first polarity bias voltage to the at least one memory resistive element of the plurality of memory resistive elements, which biases the at least one memory resistive element of the plurality of memory resistive elements into a first resistive state and then stopping the step of applying the first polarity bias voltage such that the at least one memory resistive element of the plurality of memory resistive elements holds the first resistive state; and
before receiving the magnetic resonance signals, applying a second polarity bias voltage to the at least one memory resistive element of the plurality of memory resistive elements, in order to bias the at least one memory resistive element of the plurality of memory resistive elements into a second resistive state and then stopping the step of applying the second polarity bias voltage such that the at least one memory resistive element of the plurality of memory resistive elements holds the second resistive state.

18. The method according to claim 15, wherein the at least one memory resistive element of the plurality of memory resistive elements is connected across inputs of a pre-amplifier connected with the receive RF coil, the steps of setting the resistive state including:
before transmitting the RF signals, applying a first polarity bias voltage to the at least one memory resistive element of the plurality of memory resistive elements, which biases the at least one memory resistive element of the plurality of memory resistive elements into a highly conductive state and then stopping the step of applying the first polarity bias voltage such that the at least one memory resistive element of the plurality of memory resistive elements holds the highly resistive state; and
before receiving the magnetic resonance signals, applying a second polarity bias voltage to the at least one memory resistive element of the plurality of memory resistive elements, in order to bias the at least one memory resistive element of the plurality of memory resistive elements into a highly resistive state and then stopping the step of applying the second polarity bias voltage such that the at least one memory resistive element of the plurality of memory resistive elements holds the highly resistive state.

19. The method according to claim 15, wherein a plurality of receive RF coils are connected to an RF receiver by a multiplexer which includes the plurality of memory resistive elements, the steps of setting the resistive state including:
applying a first polarity bias voltage onto at least a first one of the plurality of memory resistive elements which biases the memory resistive elements into a highly resistive state and then stopping the step of applying the first polarity bias voltage such that the first one of the plurality of the memory resistive elements hold the highly resistive state; and
applying a second polarity bias voltage onto at least a second of the plurality of memory resistive elements in order to bias the memory resistive element into a highly conductive state and then stopping the step of applying the second polarity bias voltage such that the second one of the plurality of the memory resistive elements holds the highly conductive state.

* * * * *